(12) United States Patent
Iwamoto

(10) Patent No.: US 8,427,188 B2
(45) Date of Patent: Apr. 23, 2013

(54) TEST APPARATUS

(75) Inventor: Satoshi Iwamoto, Saitama (JP)

(73) Assignee: Advantest Corporation, Tokyo (JP)

( * ) Notice: Subject to any disclaimer, the term of this patent is extended or adjusted under 35 U.S.C. 154(b) by 328 days.

(21) Appl. No.: 12/838,428

(22) Filed: Jul. 16, 2010

(65) Prior Publication Data

US 2011/0012612 A1    Jan. 20, 2011

Related U.S. Application Data

(63) Continuation of application No. PCT/JP2008/003702, filed on Dec. 10, 2008.

(30) Foreign Application Priority Data

Jan. 23, 2008    (JP) .................................. 2008-013171

(51) Int. Cl.
*G01R 31/26*    (2006.01)

(52) U.S. Cl.
USPC .................................................... 324/762.01

(58) Field of Classification Search ................. 324/537, 324/762.01–762.1, 750.01–750.3, 754.01–754.3, 324/755.01–755.1; 257/48; 438/14–18
See application file for complete search history.

(56) References Cited

U.S. PATENT DOCUMENTS

| | | | |
|---|---|---|---|
| 5,867,030 A | | 2/1999 | Sato |
| 6,118,294 A | * | 9/2000 | Umeda ..................... 324/762.02 |
| 6,133,725 A | | 10/2000 | Bowhers |
| 6,457,148 B1 | | 9/2002 | Yoshiba |
| 7,373,574 B2 | | 5/2008 | Kojima |
| 2003/0208711 A1 | | 11/2003 | Frame et al. |
| 2006/0036411 A1 | | 2/2006 | Nagai |

FOREIGN PATENT DOCUMENTS

| | | |
|---|---|---|
| JP | 08-029488 A | 2/1996 |
| JP | 08-036037 A | 2/1996 |
| JP | 2006-23233 A | 1/2000 |
| JP | 2002-507754 A | 3/2002 |
| JP | 2006-003216 A | 1/2006 |
| TW | 366430 | 8/1999 |
| TW | 422927 B | 2/2001 |
| TW | 429320 B | 4/2001 |

OTHER PUBLICATIONS

Korean Office Action dated Aug. 23, 2011, in a counterpart Korean patent applicationg No. 10-2010-7015742, citing JP2006-023233 which has been submitted in a previous IDS.
International Search Report (ISR) issued in PCT/JP2008/003702 (parent application) mailed on Feb. 2009 for Examiner consideration.
Written Opinion (PCT/ISA/237) issued in PCT/JP2008/003702 (parent application) mailed on Feb. 2009.
Taiwanese Office Action dated Aug. 27, 2012, in a counterpart Taiwanese patent application No. 097151405.

(Continued)

*Primary Examiner* — Tung X Nguyen

(57) ABSTRACT

There is provided a test apparatus for testing a device under test, including a signal supply section that supplies a test signal to the device under test via a transmission line, and a comparing and judging section that receives a response signal from the device under test via the transmission line shared with the signal supply section, and judges whether the device under test is acceptable by referring to a comparison result obtained by comparing a signal level of the response signal with a reference level corresponding to a logic pattern of the test signal.

10 Claims, 5 Drawing Sheets

OTHER PUBLICATIONS

TW Office Action/Search Report and English Translation Dated Dec. 5, 2012; Application No. 097151405.
JP Office Action/Search Report with Computer Translation Dated Dec. 4, 2012; Application No. 2009-550381.

* cited by examiner

TEST APPARATUS

BACKGROUND

1. Technical Field

The present invention relates to a test apparatus. More particularly, the present invention relates to a test apparatus that is capable of acquiring the logic value of a response signal output from a device under test without the influence of a test signal that is supplied to the device under test.

2. Related Art

A semiconductor integrated circuit such as an IC or LSI is tested by a test apparatus that inputs a predetermined test signal into the device under test, measures a response signal correspondingly output from the device under test, and judging the acceptability of the device under test based on the result of the measurement. Such a test apparatus can test whether the device under test operates normally by judging whether the logic pattern of the response signal that is output from the device under test in response to receiving the test signal that is generated based on a test pattern matches an expected value corresponding to the test pattern.

According to the test apparatus disclosed in Japanese Patent Application Publication No. 2006-023233, for example, the main part of the test apparatus is connected to a device under test in a so-called single transmission wiring fashion. Accordingly, a test signal input into the device under test propagates through the same transmission line as a response signal output from the device under test.

The above-described test apparatus may perform a test on a device under test in such a sequential manner that a test signal is input into the device under test and a response signal is then received from the device under test, for example. In this case, the response signal output from the device under test may be superimposed with a test signal to be subsequently input into the device under test, and the test apparatus may detect the resulting superimposed response signal. The above-described test apparatus, however, cancels the components of the test signal from the response signal, thereby accurately detecting the response signal output from the device under test. Unfortunately, this test apparatus disadvantageously has a complicated circuit structure due to a circuit that compares a to-be-detected signal with a comparison signal and generates the comparison signal.

SUMMARY

Therefore, it is an object of an aspect of the innovations herein to provide a test apparatus capable of overcoming the above drawbacks accompanying the related art. The above and other objects can be achieved by combinations described in the claims.

A first aspect of the innovations may include a test apparatus for testing a device under test, including a signal supply section that supplies a test signal to the device under test via a transmission line, and a comparing and judging section that receives a response signal from the device under test via the transmission line shared with the signal supply section, and judges whether the device under test is acceptable by referring to a comparison result obtained by comparing a signal level of the response signal with a reference level corresponding to a logic pattern of the test signal.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
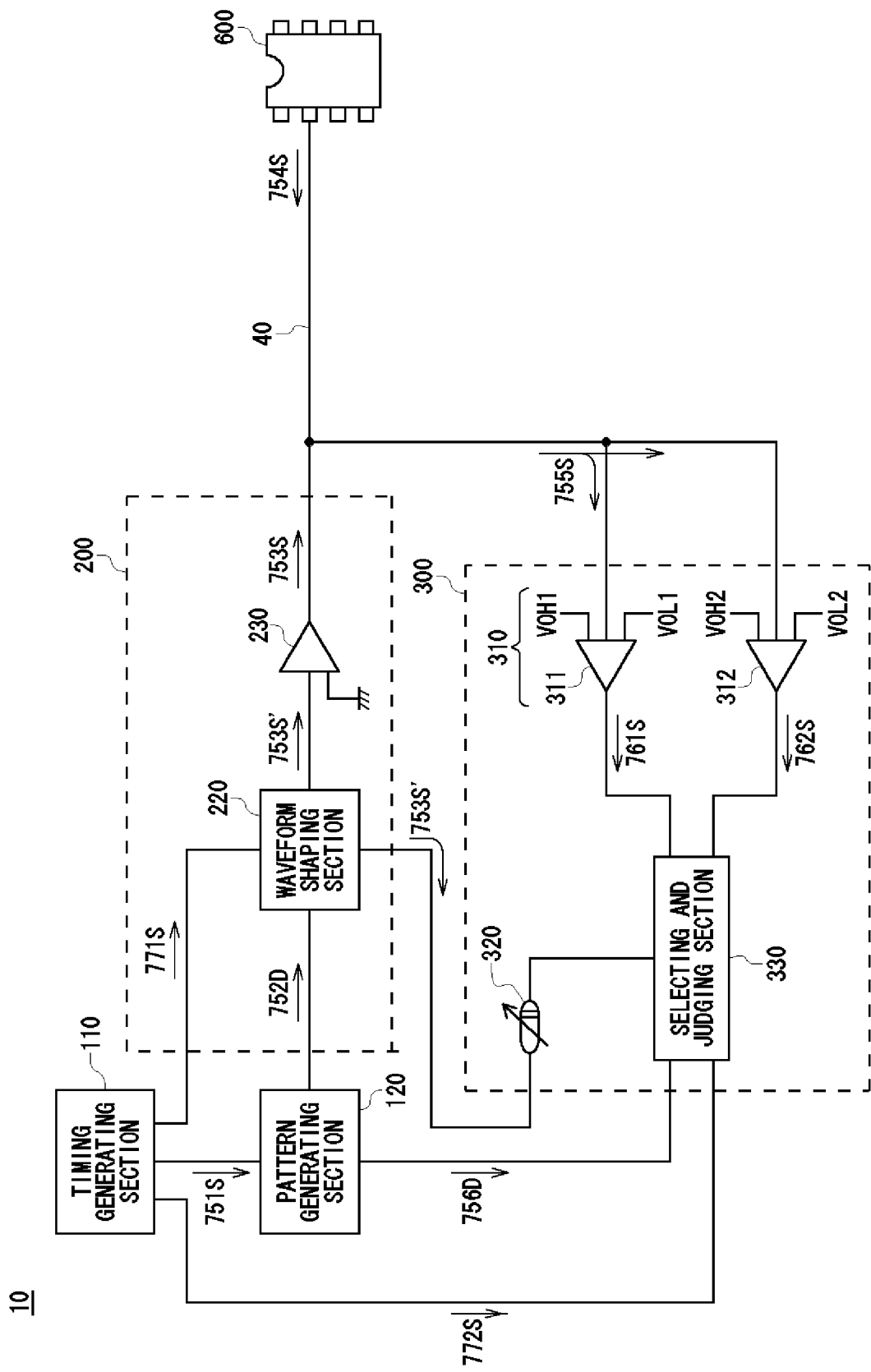
FIG. 1 illustrates the overall structure of a test apparatus 10 relating to an embodiment of the present invention.

FIG. 1 illustrates the overall structure of a test apparatus 10 relating to an embodiment of the present invention. The test apparatus 10 is designed to test a device under test 600 such as an IC or LSI, and is constituted by a timing generating section 110, a pattern generating section 120, a signal supply section 200, and a comparing and judging section 300. The signal supply section 200 and the comparing and judging section 300 are electrically connected to a terminal of the device under test 600 via a common transmission line 40. The test apparatus 10 executes a predetermined test program, to generate a test signal based on a test pattern corresponding to the test program, supply the test signal to the device under test 600, compare the logic value of the response signal output from the device under test 600 against an expected value corresponding to the test pattern, and judge whether the device under test 600 is acceptable based on the result of the comparison, for example.

The timing generating section 110 generates a periodic signal 751S, a timing signal 771S, and a timing signal 772S. The timing generating section 110 supplies the periodic signal 751S, the timing signal 771S, and the timing signal 772S respectively to the pattern generating section 120, the signal supply section 200, and the comparing and judging section 300.

The pattern generating section 120 executes a predetermined test program when receiving the test program from, for example, an external control apparatus, to generate a test pattern 752D based on the periodic signal 751S supplied from the timing generating section 110. The pattern generating section 120 sends the generated test pattern 752D to the signal supply section 200. The test pattern 752D generated by the pattern generating section 120 is formed by arranging the H and L logics in accordance with what is to be tested, and includes pattern data to be included in a test signal 753S that is to be supplied to the device under test 600 from the signal supply section 200 for the purpose of testing the device under test 600.

The pattern generating section 120 also generates an expected value pattern 756D, based on the periodic signal 751S supplied from the timing generating section 110. The expected value pattern 756D includes logic values (expected values) of a response signal 754S that is expected to be output from the device under test 600 in response to receiving the test signal 753S. The pattern generating section 120 sends the generated expected value pattern 756D to the comparing and judging section 300.

The signal supply section 200 includes a waveform shaping section 220 and a driver 230, and supplies the test signal 753S to the device under test 600 via the transmission line 40. The waveform shaping section 220 shapes a waveform based on the test pattern 752D received from the pattern generating section 120, in accordance with the timing of the timing signal 771S supplied from the timing generating section 110, and sends the shaped waveform to the driver 230 and the comparing and judging section 300 in the form of a test signal 753S'.

The driver 230 is a voltage source that amplifies a voltage level of an input signal, for example, and outputs the amplified voltage level. The driver 230 amplifies the voltage level corresponding to the logic value of each of the bits of the test signal 753' received from the waveform shaping section 220 and outputs the amplified voltage level to the device under test 600 via the transmission line 40 in the form of the test signal 753S. In this example, the output impedance of the driver 230 is set substantially equal to the characteristic impedance of the transmission line 40 and the input impedance of the device under test 600. Thus, the test signal 753S output from the driver 230 is transmitted through the transmission line 40 and input into the device under test 600 with little reflection-induced attenuation.

The comparing and judging section 300 includes a comparing section 310, a delay section 320, and a selecting and judging section 330. The comparing and judging section 300 receives the response signal 754S output from the device under test 600, which has been delayed by the propagation delay time of the transmission line 40 from the output timing. Here, if the input of the response signal 754S into the comparing and judging section 300 occurs at the same timing as the output of the test signal 753S from the signal supply section 200, the comparing and judging section 300 receives a superimposition signal 755S in which the test signal 753S is at least partly superimposed onto the response signal 754S. The comparing and judging section 300 detects the logic value of the response signal 754S in the received superimposition signal 755S, compares the detected logic value of the response signal 754S with the expected value of the response signal 754S, and judges whether the device under test 600 is acceptable based on the result of the comparison.

The comparing section 310 includes a first comparator 311 and a second comparator 312. On reception of the superimposition signal 755S, the first comparator 311 compares the voltage level of each of the cycles of the superimposition signal 755S with a predetermined voltage level VOH1 and a predetermined voltage level VOL1, which is lower than the voltage level VOH1, and outputs a comparison result 761S to the selecting and judging section 330. For example, when the voltage level of a cycle of the received superimposition signal 755S is higher than the voltage level VOH1, the first comparator 311 outputs to the selecting and judging section 330 a comparison result 761S indicating that the logic value of the cycle is H logic. When the voltage level of a cycle of the received superimposition signal 755S is lower than the voltage level VOL1, the first comparator 311 outputs to the selecting and judging section 330 a comparison result 761S indicating that the logic value of the cycle is L logic.

On reception of the superimposition signal 755S, the second comparator 312 compares the voltage level of each of the cycles of the superimposition signal 755S with a predetermined voltage level VOH2 and a predetermined voltage level VOL2, which is lower than the voltage level VOH2, and outputs a comparison result 762S to the selecting and judging section 330. For example, when the voltage level of a cycle of the received superimposition signal 755S is higher than the voltage level VOH2, the second comparator 312 outputs to the selecting and judging section 330 a comparison result 762S indicating that the logic value of the cycle is H logic. When the voltage level of a cycle of the received superimposition signal 755S is lower than the voltage level VOL2, the second comparator 312 outputs to the selecting and judging section 330 a comparison result 762S indicating that the logic value of the cycle is L logic.

The comparison results 761S and 762S are both obtained by comparing the voltage level of each of the cycles of the superimposition signal 755S with the predetermined voltage levels set at the respective comparators of the comparing section 310, as described above. Stated differently, these comparison results are obtained by comparing, against the predetermined voltage levels set at the respective comparators of the comparing section 310, the voltage level that is produced by superimposing the voltage level of the test signal 753S onto the voltage level of the response signal 754S.

The delay section 320 delays the test signal 753S' supplied from the waveform shaping section 220 by a predetermined phase and supplies the delayed test signal 753S' to the selecting and judging section 330. The selecting and judging section 330 selects one of the comparison result 761S output from the first comparator 311 of the comparing section 310 and the comparison result 762S output from the second comparator 312, by referring to the logic value of the test signal 753' supplied thereto, and acquires the logic value of the selected comparison result in accordance with the strobe timing indicated by the timing signal 772S supplied from the timing generating section 110.

The selecting and judging section 330 judges whether the device under test 600 is acceptable based on the acquired logic value of the comparison result. For example, the delay section 320 preferably delays the test signal 753S' such that the timing at which the test signal 753S' is supplied to the selecting and judging section 330 of the comparing and judging section 300 matches the timing at which the selecting and judging section 330 should select one of the comparison results 761S and 762S obtained for the superposition signal 755S in which the test signal 753S output from the driver 230 is superimposed.

Figure 2:
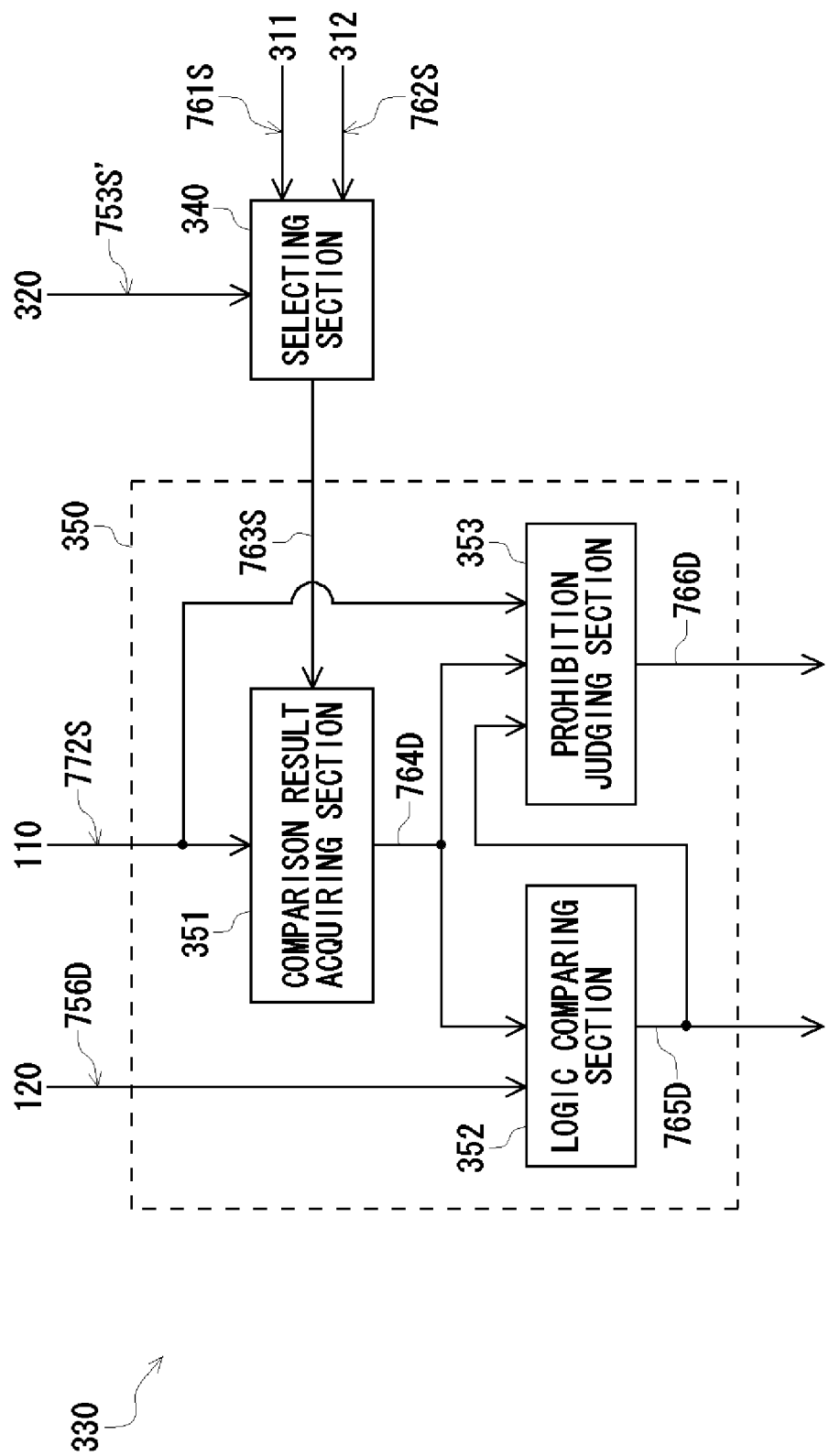
FIG. 2 illustrates an exemplary structure of a selecting and judging section 330.

FIG. 2 illustrates an exemplary structure of the selecting and judging section 330. As shown in FIG. 2, the selecting and judging section 330 includes a selecting section 340 and a judging section 350. The selecting section 340 refers to the logic value of the test signal 753S' received from the waveform shaping section 220 via the delay section 320, in order to select one of the comparison result 761S output from the first comparator 311 of the comparing section 310 and the comparison result 762S output from the second comparator 312.

For example, the selecting section 340 determines which one of the logic values of the test signal 753S is superimposed in the superimposition signal 755S input into the comparing and judging section 300, by referring to the logic value of each of the bits of the test signal 753S', and selects one of the comparison results 761S and 762S by referring to the determined superimposed logic value. Specifically speaking, when the logic value of the test signal 753S' is H logic, that is to say, when the driver 230 outputs a test signal 753S indicating H logic, the selecting section 340 selects the comparison result 761S. On the other hand, when the logic value of the test signal 753S' is L logic, that is to say, when the driver 230 outputs a test signal 753S indicating L logic, the selecting section 340 selects the comparison result 762S.

The selecting section 340 outputs, to the judging section 350, a selection result signal 763S including the logic values selected from one of the comparison results 761S and 762S. Here, the selecting section 340 preferably selects one of the comparison results 761S and 762S in accordance with the timing of each of the cycles of the test signal 753S'.

The judging section 350 includes a comparison result acquiring section 351, a logic comparing section 352, and a prohibition judging section 353. The judging section 350 judges whether the device under test 600 is acceptable based on the comparison result selected by the selecting section 340. The comparison result acquiring section 351 acquires the logic value of the selection result signal 763S output from the selecting section 340, in accordance with the strobe timing indicated by the timing signal 772S supplied from the timing generating section 110. The comparison result acquiring section 351 outputs, to the logic comparing section 352 and the prohibition judging section 353, a logic pattern 764D including the acquired logic value. The comparison result acquiring section 351 may be, for example, a flip-flop or latch.

The logic comparing section 352 compares the logic value of the logic pattern 764D supplied from the comparison result acquiring section 351 with the logic value of the expected value pattern 756D supplied from the pattern generating section 120. The logic comparing section 352 makes a pass judgment when the both logic values match each other, and makes a fail judgment when the logic values do not match each other. The logic comparing section 352 outputs, to the prohibition judging section 353, a pass/fail judgment result 765D indicating the made pass or fail judgment. In this example, the logic comparing section 352 may output the pass/fail judgment result 765D to a different component of the test apparatus 10 (for example, a fail memory). Alternatively, the logic comparing section 352 may judge whether the device under test 600 is acceptable based on the pass/fail judgment result 765D and output the judgment result indicating whether the device under test 600 is acceptable to the prohibition judging section 353.

The prohibition judging section 353 detects the strobe timing at which the comparison result acquiring section 351 acquires the logic value of the selection result signal 763S, by referring to the strobe timing indicated by the timing signal 772S supplied from the timing generating section 110. The prohibition judging section 353 judges whether the detected strobe timing falls within a prohibition region that is defined according to the edge timing at which the logic value of the test signal 753S transits from H logic to L logic or from L logic to H logic.

Furthermore, when the detected strobe timing falls within the prohibition region, the prohibition judging section 353 generates an error flag 766D in association with the logic value of the selection result signal 763S that is acquired in accordance with the detected strobe timing and the pass/fail judgment result 765D correspondingly produced by the logic comparing section 352. In this example, the prohibition judging section 353 may output the error flag 766D to a different component of the test apparatus 10 (for example, a fail memory). When configured to receive the judgment result indicating whether the device under test 600 is acceptable from the logic comparing section 352, the prohibition judging section 353 may generate the error flag 766D in association with the acceptability judgment result.

The following specifically describes how the test apparatus 10 tests the device under test 600.

Figure 3:
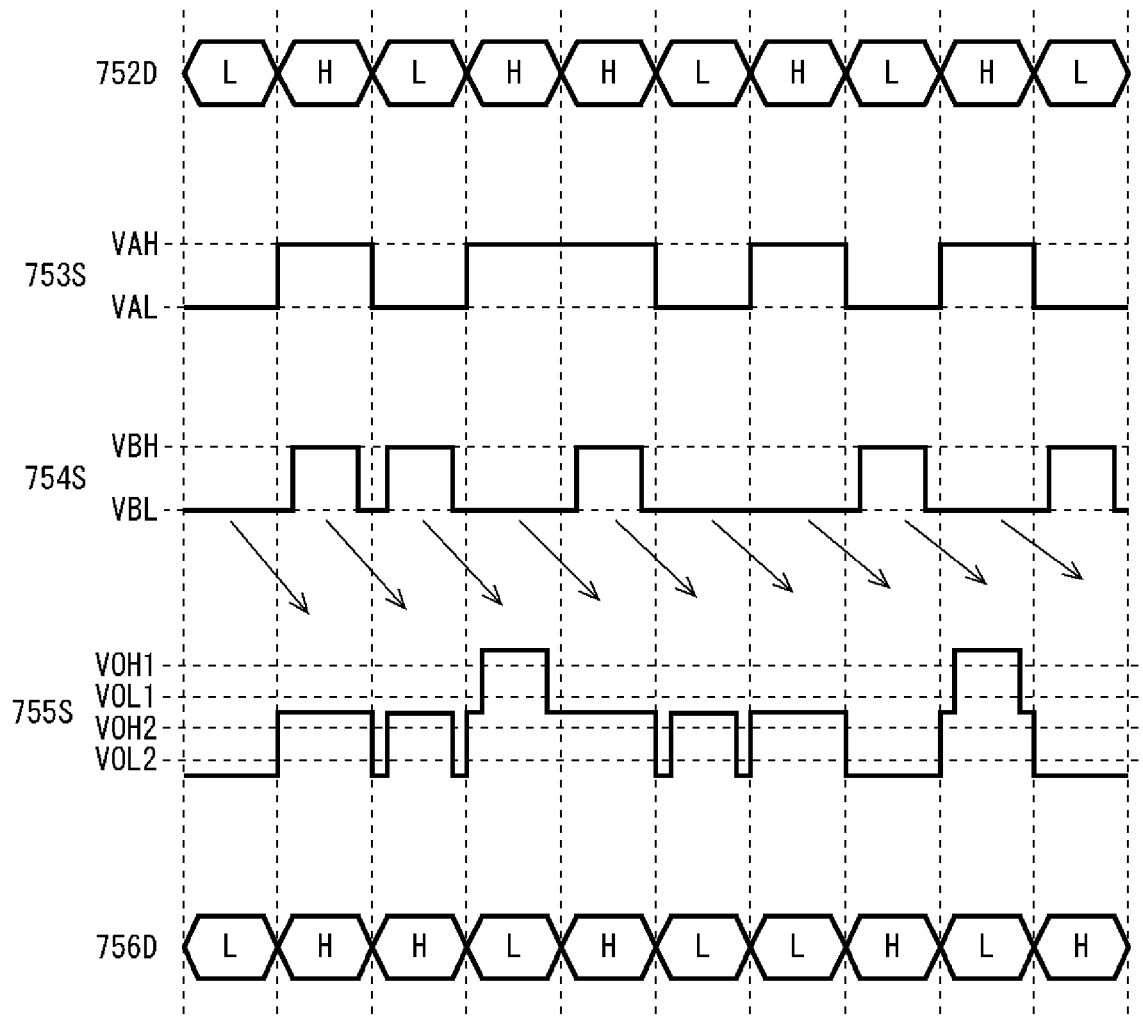
FIG. 3 is a timing chart illustrating an example of a test performed by the test apparatus 10 on a device under test 600.

FIG. 3 is a timing chart illustrating an example of a test performed by the test apparatus 10 on the device under test 600. FIG. 3 shows the data sequences and waveforms of the earlier mentioned patterns and signals, which are determined by their reference numerals presented on the left. FIG. 3 shows particular 10 cycles C1 to C10 during the test performed on the device under test 600.

In the cycles C1 to C10, when the waveform shaping section 220 receives a test pattern 752D having logic values "LHLHHLHLHL," the driver 230 outputs to the device under test 600 a test signal 753S corresponding to the logic values of the test pattern 752D. The device under test 600, on the other hand, outputs a response signal 754S having a waveform corresponding to the logic values "LHHLHLLHLH" in the cycles C1 to C10.

Here, the propagation delay time that is defined as a time period from when the device under test 600 outputs the response signal 754S to when the comparing section 310 of the comparing and judging section 300 receives the response signal 754S after its propagation through the transmission line 40 is assumed to be equivalent to the duration of one cycle, for the sake of simplicity. Furthermore, the propagation delay time that is defined as a time period from when the driver 230 outputs the test signal 753S to when the comparing section 310 of the comparing and judging section 300 receives the test signal 753S is assumed to be negligible.

In the cycles C1 to C10, the comparing section 310 of the comparing and judging section 300 receives a superimposition signal 755S having a waveform generated by superimposing the test signal 753S whose waveform corresponds to the logic values "LHLHHLHLHL" onto the response signal 754S whose waveform corresponds to the logic values "LLHHLHLLHL" (i.e., the logic value "LHHLHLLHLH" of the response signal 754S output from the device under test 600 are delayed by one cycle).

The first comparator 311 of the comparing section 310 compares the voltage level of each of the cycles of the superimposition signal 755S with the predetermined voltage levels VOH1 and VOL1 and outputs a comparison result 761S to the selecting and judging section 330. In this example, the first comparator 311 outputs, to the selecting and judging section 330, a comparison result 761S having a waveform corresponding to the logic values "LLLHLLLLHL" in the cycles C1 to C10. Here, the voltage levels VOH1 and VOL1 are set so as to separate the logic value of the response signal 754S from the logic value of the superimposition signal 755S in a case where the test signal 753S having H logic is superimposed on the response signal 754S in the superimposition signal 755S, for example.

The second comparator 312 of the comparing section 310 compares the voltage level of each of the cycles of the superimposition signal 755S with the predetermined voltage levels VOH2 and VOL2 and outputs a comparison result 762S to the selecting and judging section 330. In this example, the second comparator 312 outputs, to the selecting and judging section 330, a comparison result 762S having a waveform corresponding to the logic values "LHHHHHHLHL" in the cycles C1 to C10. Here, the voltage levels VOH2 and VOL2 are set so as to separate the logic value of the response signal 754S from the logic value of the superimposition signal 755S in a case where the test signal 753S having L logic is superimposed on the response signal 754S in the superimposition signal 755S, for example.

In the cycles C1 to C10, for example, the selecting section 340 of the selecting and judging section 330 selects the comparison result 761S when the logic value of the test signal 753S' supplied from the waveform shaping section 220 via the delay section 320 is H logic, in this example, in the cycles C2, C4, C5, C7 and C9. Furthermore, in the cycles C1 to C10, the selecting section 340 of the selecting and judging section 330 selects the comparison result 762S when the logic value of the test signal 753S' is L logic, in this example, in the cycles C1, C3, C6, C8 and C10. Thus, the selecting section 340 selects one of the comparison results 761S and 762S by referring to the logic value of the test signal 753S' having the same logic pattern as the test signal 753S. This enables the selecting section 340 to output, to the comparison result acquiring section 351 of the judging section 350, the selection result signal 763S having a logic value corresponding to the voltage level obtained by eliminating the voltage level of the test signal 753S from the voltage level of the superimposition signal 755S, that is to say, a logic value corresponding to the voltage level of the response signal 754S.

In this example, the selecting section 340 outputs a selection result signal 763S having logic values "LLHHLHLLHL" to the comparison result acquiring section 351 of the judging section 350 in the cycles C1 to C10. The comparison result acquiring section 351 detects the logic value of the selection result signal 763S supplied from the selecting section 340, in accordance with the strobe timing indicated by the timing signal 772S supplied from the timing generating section 110. The comparison result acquiring section 351 then acquires the detected logic value. The comparison result acquiring section 351 outputs, to the logic comparing section 352 and the prohibition judging section 353, a logic pattern 764D having the acquired logic values or logic values "LLHHLHLLHL" in the cycles C1 to C10.

The logic comparing section 352 compares the logic value of the logic pattern 764D supplied from the comparison result acquiring section 351 with the logic value of the expected value pattern 756D supplied from the pattern generating section 120. In this example, the expected value pattern 756D supplied to the logic comparing section 352 has logic values "LLHHLHLLHL" in the cycles C1 to C10.

In the cycles C1 to C10, the logic comparing section 352 makes a pass judgment indicating that the logic values match each other based on the result of the above-described comparison and outputs a pass judgment result 765D indicating the pass judgment to the prohibition judging section 353. The prohibition judging section 353 subsequently operates as described above, which will not be described here.

As described above, when the comparing and judging section 300 detects a signal in which the test signal 753S is superimposed onto the response signal 754S, the test apparatus 10 relating to the present embodiment can eliminate the components of the test signal 753S from the detected signal and thus compare the logic value of the response signal 754S with the logic value of the expected value pattern. Therefore, the comparing and judging section 300 can accurately detect the response signal 754S output from the device under test 600. Consequently, the test apparatus 10 relating to the present embodiment can more accurately judge whether the device under test 600 is acceptable.

Furthermore, the test apparatus 10 relating to the present embodiment can perform tests without taking the influences of the so-called I/O dead bands into consideration since the comparing and judging section 300 can accurately detect the response signal 754S even while detecting the test signal 753S output from the signal supply section 200. Consequently, the test apparatus 10 relating to the present embodiment can more efficiently test the device under test 600.

Figure 4:
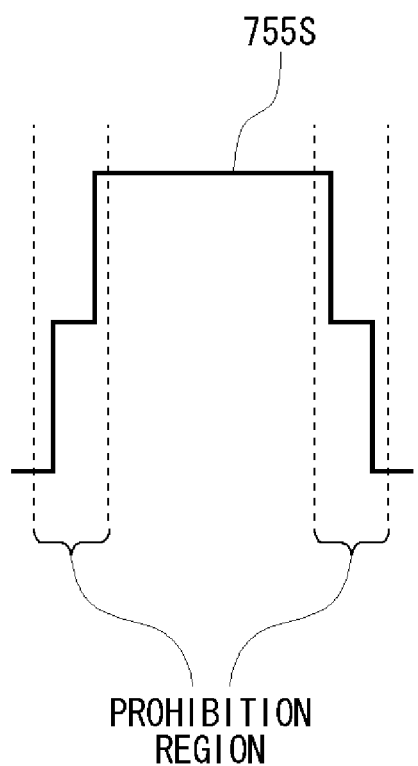
FIG. 4 is an enlargement view showing the signal waveform of an superimposition signal 755S in a cycle C9.

FIG. 4 is an enlargement view showing the signal waveform of the superimposition signal 755S in the cycle C9. As shown in FIG. 4, the prohibition region may be defined as a predetermined region in the vicinity of the edge timing at which the signal waveform of the superimposition signal 755S transits, for example. The prohibition judging section 353 judges whether the strobe timing, which is indicated by the timing signal 772S, at which the comparison result acquiring section 351 acquires the logic value of the selection result signal 763S falls within the prohibition region shown in FIG. 4.

Thus, the prohibition judging section 353 can prevent the test apparatus 10 from judging the acceptability of the device under test 600 by referring to the inappropriate logic value of the selection result signal 763S that is acquired by the comparison result acquiring section 351 at an inappropriate strobe timing. Furthermore, the prohibition judging section 353 can output the error flag 766D to indicate that the timing signal 751S is inappropriately timed.

Figure 5:
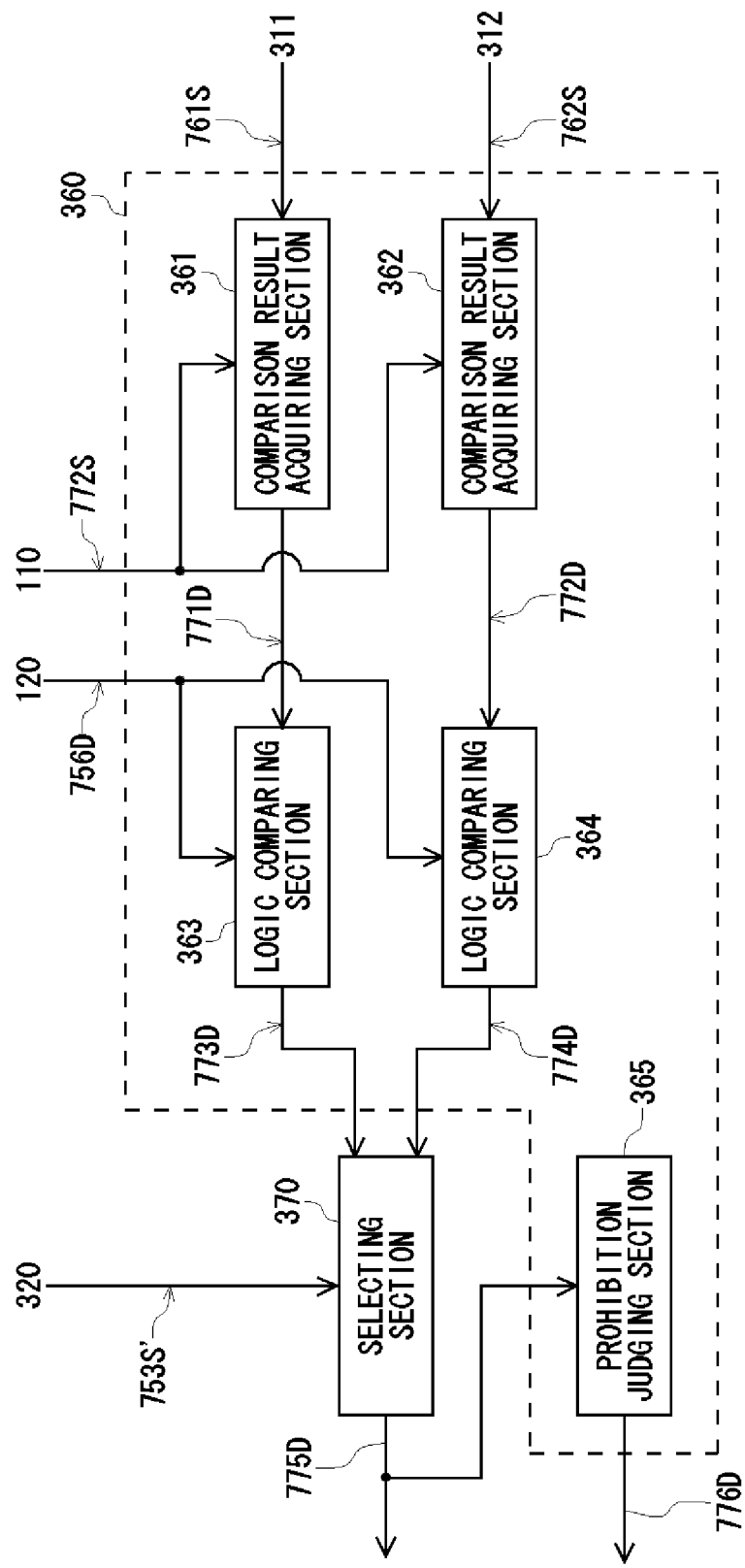
FIG. 5 illustrates another exemplary structure of the selecting and judging section 330.

FIG. 5 illustrates another exemplary structure of the selecting and judging section 330. According to this modification example, the selecting and judging section 330 includes a judging section 360 and a selecting section 370. The judging section 360 includes comparison result acquiring sections 361 and 362, logic comparing sections 363 and 364, and a prohibition judging section 365. The selecting and judging section 330 judges whether the response signal 754S is acceptable in each cycle by referring to the comparison result 761S supplied from the first comparator 311 and the comparison result 762S supplied from the second comparator 312, and outputs the judgments.

The comparison result acquiring section 361 detects the logic value of the comparison result 761S supplied from the first comparator 311, in accordance with the strobe timing indicated by the timing signal 772S supplied from the timing generating section 110. The comparison result acquiring section 361 acquires the detected logic value and outputs a logic pattern 771D including the acquired logic value to the logic comparing section 363.

The comparison result acquiring section 362 detects the logic value of the comparison result 762S supplied from the second comparator 312, in accordance with the strobe timing indicated by the timing signal 772S supplied from the timing generating section 110. The comparison result acquiring section 362 acquires the detected logic value and outputs a logic pattern 772D including the acquired logic value to the logic comparing section 364.

The logic comparing section 363 compares the logic value of the logic pattern 771D supplied from the comparison result acquiring section 361 with the logic value of the expected value pattern 756D supplied from the pattern generating section 120. The logic comparing section 363 makes a pass judgment when the both logic values match each other, and makes a fail judgment when the logic values do not match each other. The logic comparing section 363 outputs, to the selecting section 370, a pass/fail judgment result 773D indicating the made pass or fail judgment.

The logic comparing section 364 compares the logic value of the logic pattern 772D supplied from the comparison result acquiring section 362 with the logic value of the expected value pattern 756D supplied from the pattern generating section 120. The logic comparing section 364 makes a pass judgment when the both logic values match each other, and makes a fail judgment when the logic values do not match each other. The logic comparing section 364 outputs, to the selecting section 370, a pass/fail judgment result 774D indicating the made pass or fail judgment.

The selecting section 370 determines which one of the logic values of the test signal 753S is superimposed in the superimposition signal 755S input into the comparing and judging section 300, based on the logic value of each of the bits of the test signal 753S', and selects one of the pass/fail judgment result 773D and the pass/fail judgment result 774D by referring to the determined superimposed logic value. The selecting section 370 outputs, to the prohibition judging section 365 of the judging section 360, a selection result signal 775S indicating the selected one of the pass/fail judgment result 773D and the pass/fail judgment result 774D. The prohibition judging section 365 operates in substantially the same manner as the prohibition judging section 353 described above, which will not be described here.

When the selecting and judging section 330 includes the above-described judging section 360 and selecting section 370, the test apparatus 10 can produce similar effects as the case where the selecting and judging section 330 includes the selecting section 340 and judging section 350. Specifically speaking, when the signal received by the comparing and judging section 300 has the response signal 754S and the test signal 753S being superimposed on each other, the test apparatus 10 can eliminate the components of the test signal 753S from the signal received by the comparing and judging section 300 and thus compare the logic value of the response signal 754S with the logic value of the expected value pattern 756D. Therefore, the comparing and judging section 300 can accurately detect the response signal 754S output from the device under test 600. Accordingly, the test apparatus 10 can more accurately judge whether the device under test 600 is acceptable.

According to this modification example, the test apparatus 10 can also perform tests without taking the influences of the so-called I/O dead bands into consideration since the comparing and judging section 300 can accurately detect the response signal 754S even while detecting the test signal 753S output from the signal supply section 200. Consequently, the test apparatus 10 relating to the modification example can more efficiently test the device under test 600.

Referring to the test apparatus 10 relating to the embodiment of the present invention, the comparing section 310 of the comparing and judging section 300 may include three or more comparators depending on the number of the voltage levels of the superimposition signal 755S. For example, when the driver 230 is configured to further exhibit high impedance in addition to outputting the H and L logics and the comparing and judging section 300 is configured to additionally receive from the device under test 600 a predetermined voltage level different from the voltage levels corresponding to the H and L logics, the comparing section 310 of the comparing and judging section 300 may further include a comparator that is designed to detect the voltage corresponding to the high impedance. As another example, when the driver 230 is configured to output the voltage level corresponding to H logic, the voltage level corresponding to L logic, and a predetermined voltage (reference voltage) different from the voltage levels corresponding to the H and L logics, the comparing section 310 of the comparing and judging section 300 may further include a comparator that is designed to detect the reference voltage.

When the response signal output from the device under test 600 has a waveform defined by three different voltage levels and thus represent three different values, for example, the first and second comparators 311 and 312 of the comparing section 310 in the test apparatus 10 may be alternatively configured so as to function as a multi-valued measuring section and acquire the logic value of the three-valued response signal.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus for testing a device under test, comprising:
   a signal supply section that supplies a test signal to the device under test via a transmission line; and
   a comparing and judging section that receives a response signal from the device under test via the transmission line shared with the signal supply section, and judges whether the device under test is acceptable by referring to a comparison result obtained by comparing a signal level of the response signal with a reference level corresponding to a logic pattern of the test signal, wherein
   the comparing and judging section includes:
   a first comparator that compares the signal level of the response signal with a first reference level to obtain a first comparison result and outputs the first comparison result;
   a second comparator that compares the signal level of the response signal with a second reference level to obtain a second comparison result and outputs the second comparison result, the second reference level being different from the first reference level; and
   a selecting and judging section that judges whether the device under test is acceptable, by referring to one of the first comparison result and the second comparison result that is selected in accordance with the logic pattern of the test signal.

2. The test apparatus as set forth in claim 1, wherein
   the selecting and judging section has:
   a selecting section that selects one of the first comparison result and the second comparison result by referring to the logic pattern of the test signal; and
   a judging section that judges whether the device under test is acceptable by referring to the comparison result selected by the selecting section.

3. The test apparatus as set forth in claim 2, further comprising:
   a pattern generating section that generates the logic pattern of the test signal and supplies the logic pattern to the signal supply section; and
   a delay section that delays the logic pattern of the test signal generated by the pattern generating section and supplies the delayed logic, pattern to the selecting section.

4. The test apparatus as set forth in claim 3, wherein
   the judging section has:
   a comparison result acquiring section that acquires a logic value of the selected comparison result in accordance with a predetermined strobe timing;
   a logic comparing section that compares the logic value of the selected comparison result that is acquired by the comparison result acquiring section with an expected value supplied thereto; and
   a prohibition judging section that judges whether the predetermined strobe timing used by the comparison result acquiring section falls within a prohibition region defined according to an edge timing at which a logic value of the test signal transits.

5. The test apparatus as set forth in claim 4, wherein when the predetermined strobe timing falls within the prohibition region, the prohibition judging section generates an error flag in association with the logic value acquired in accordance with the predetermined strobe timing and a result of the comparison done by the logic comparing section.

6. The test apparatus as set forth in claim 5, wherein the signal supply section includes a driver that outputs one of H logic and IL logic, and
the selecting section selects one of the first comparison result and the second comparison result depending on which one of the H logic and the L logic is output from the driver.

7. The test apparatus as set forth in claim 6, wherein the first reference level is higher than the second reference level, and
the selecting section selects the first comparison result when the driver outputs the H logic and selects the second comparison result when the driver outputs the L logic.

8. The test apparatus as set forth in claim 7, wherein the comparing and judging section further includes a third comparator that compares the signal level of the response signal with a third reference level to obtain a third comparison result and outputs the third comparison result,
the third reference level is different from the first and second reference levels, and
the selecting section selects the third comparison result when an output of the driver is at high impedance.

9. The test apparatus as set forth in claim 1, wherein the selecting and judging section includes:
a judging section that judges whether the device under test is acceptable (i) by referring to the first comparison result to obtain a first judgment result and (ii) by referring to the second comparison result to obtain a second judgment result and outputs the first judgment result and the second judgment result; and
a selecting section that selects one of the first judgment result and the second judgment result by referring to the logic pattern of the test signal.

10. The test apparatus as set forth in claim 1, further comprising
a multi-valued measuring section that acquires a logic value of a multi-valued response signal by referring to the first comparison result and the second comparison result.

* * * * *